United States Patent [19]
Benner

[11] Patent Number: 6,040,576
[45] Date of Patent: Mar. 21, 2000

[54] ENERGY FILTER, PARTICULARLY FOR AN ELECTRON MICROSCOPE

[75] Inventor: Gerd Benner, Aalen, Germany

[73] Assignee: Leo Elektronenmikroskopie GmbH, Germany

[21] Appl. No.: 09/145,397

[22] Filed: Sep. 1, 1998

[30] Foreign Application Priority Data

Sep. 1, 1997 [DE] Germany .......................... 197 38 070

[51] Int. Cl.[7] .................................................. H01J 37/26
[52] U.S. Cl. ........................................... 250/305; 250/311
[58] Field of Search ..................... 250/305, 311, 250/310, 396 R

[56] References Cited

U.S. PATENT DOCUMENTS

| | | |
|---|---|---|
| 4,071,765 | 1/1978 | Van Oostrum et al. ................. 250/311 |
| 4,740,704 | 4/1988 | Rose et al. . |
| 4,760,261 | 7/1988 | Rose et al. . |
| 4,812,652 | 3/1989 | Egle et al. . |
| 5,013,913 | 5/1991 | Benner . |
| 5,449,914 | 9/1995 | Rose et al. . |
| 5,483,073 | 1/1996 | Benner . |

*Primary Examiner*—Kiet T. Nguyen

[57] ABSTRACT

An energy filter, particularly for electron microscopes, in which the setting of different energy bandwidths takes place electron-optically. For this purpose, one or more deflecting systems and one or more transfer lenses are provided at the filter exit. A diaphragm arrangement is arranged in the dispersion plane and has an opening with a stepped edge region. Slit diaphragms with different slit lengths can be simulated by deflection of the electron beam. The deflection of the electron beam effected by the dispersion system(s) perpendicularly to the dispersive direction of the filter is compensated again by a succeeding transfer lens or a further deflecting system, so that an image displacement is also compensated. In a second embodiment, a respective slit edge is arranged in two mutually conjugate spectrum planes. A deflecting system preceding each slit edge, different spectrum portions are filtered out by the two slit edges, according to the excitation of the deflecting systems. The energy bandwidth can be varied continuously in this embodiment.

13 Claims, 3 Drawing Sheets

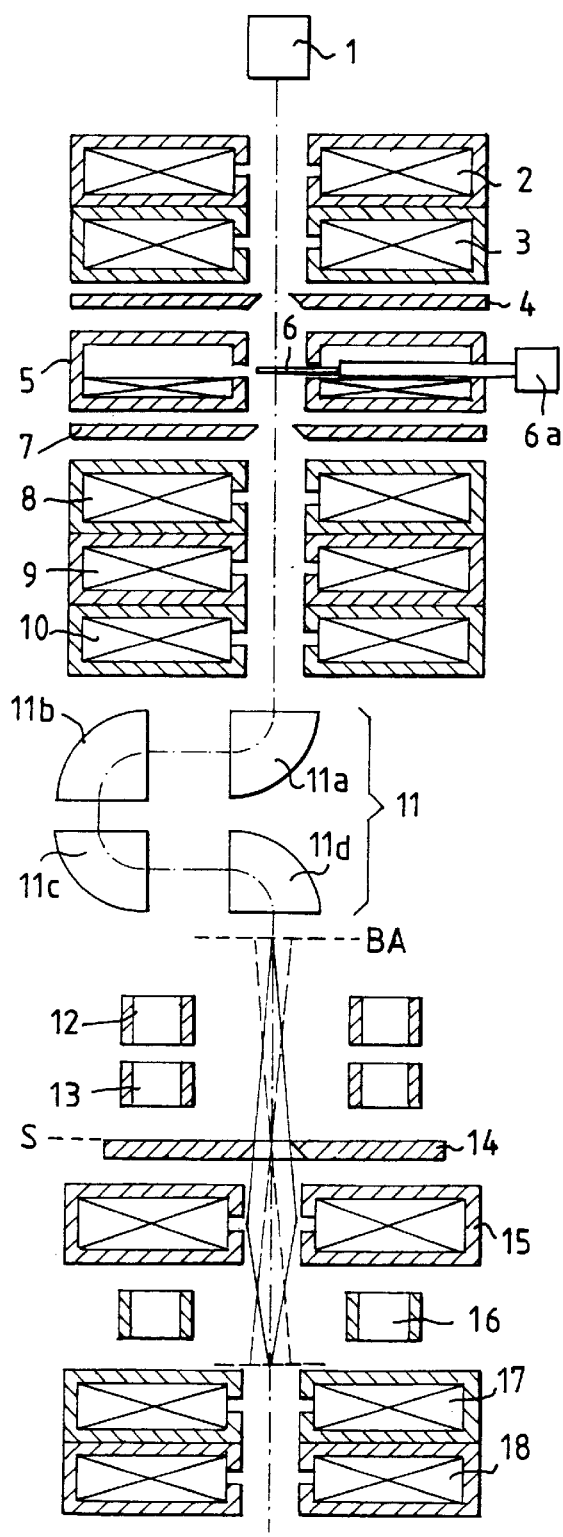
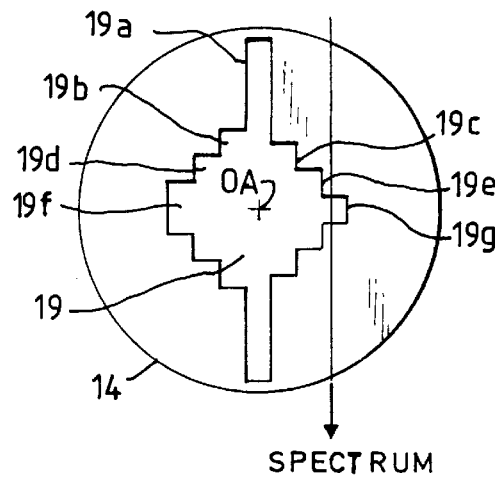
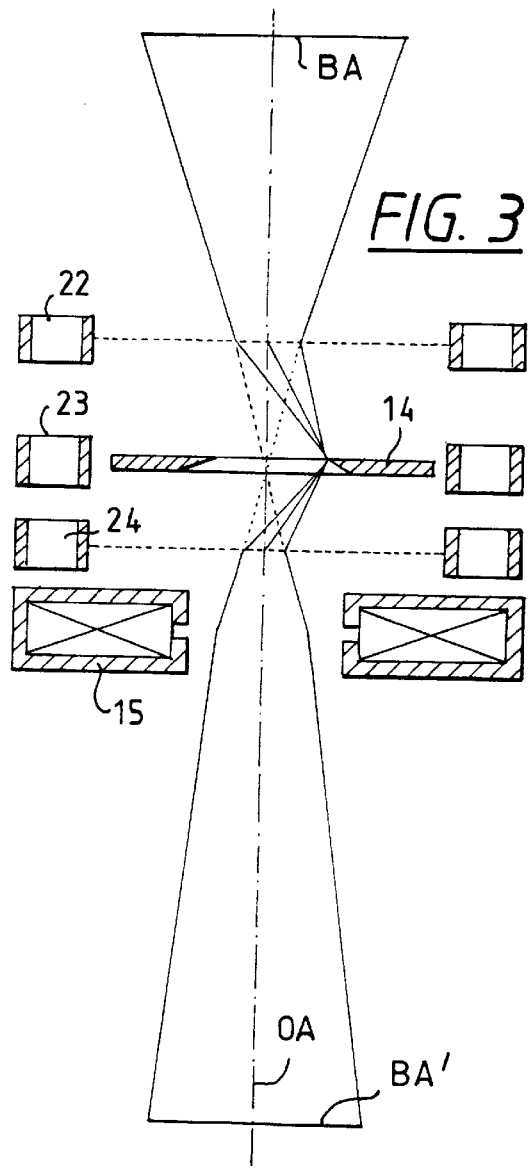

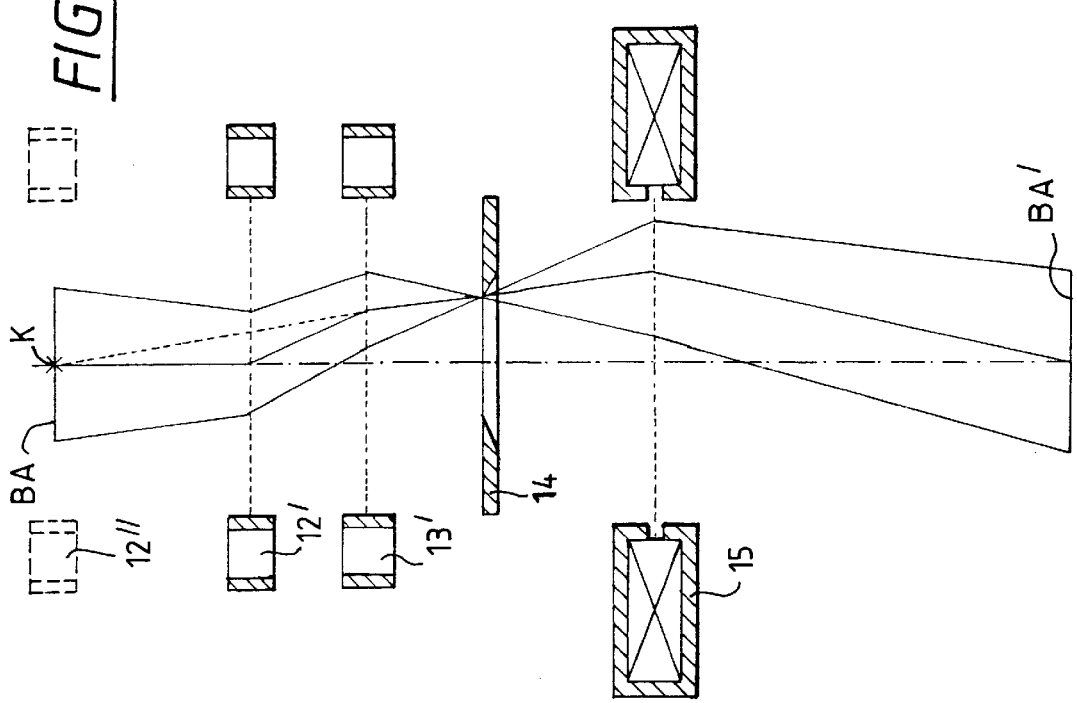
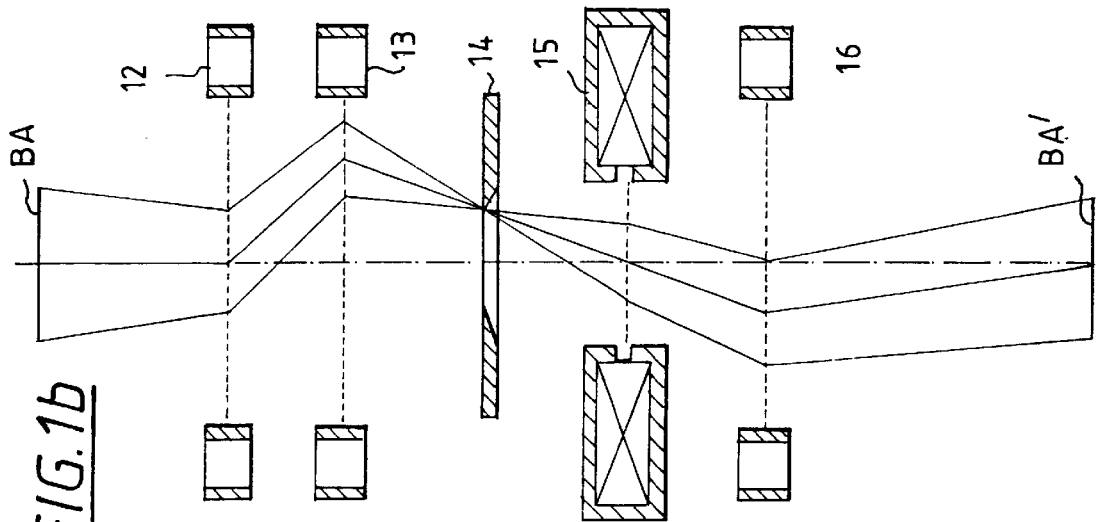

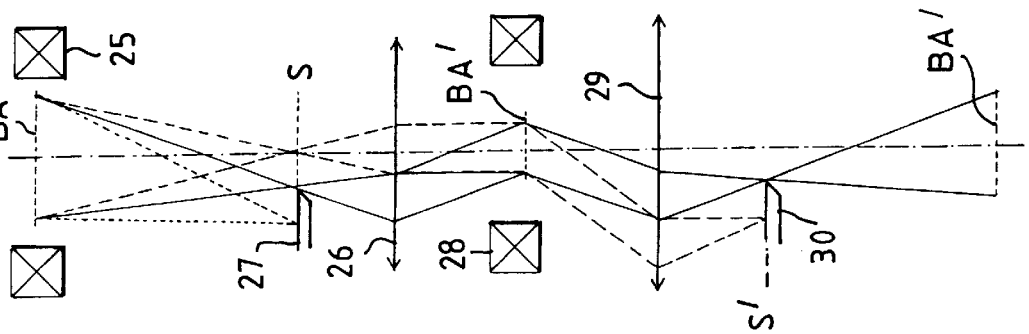
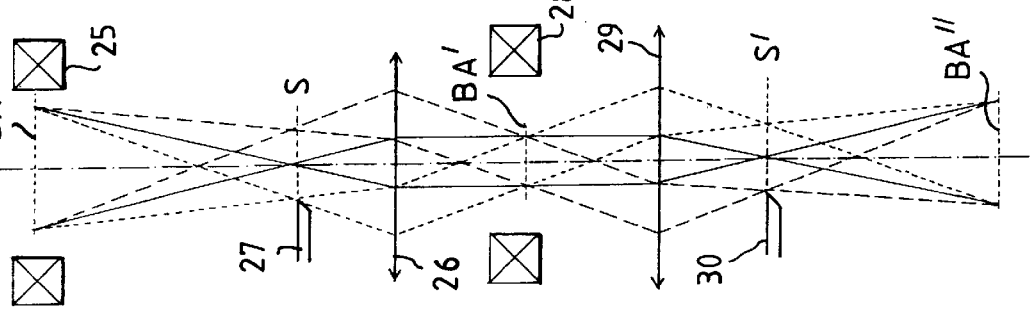
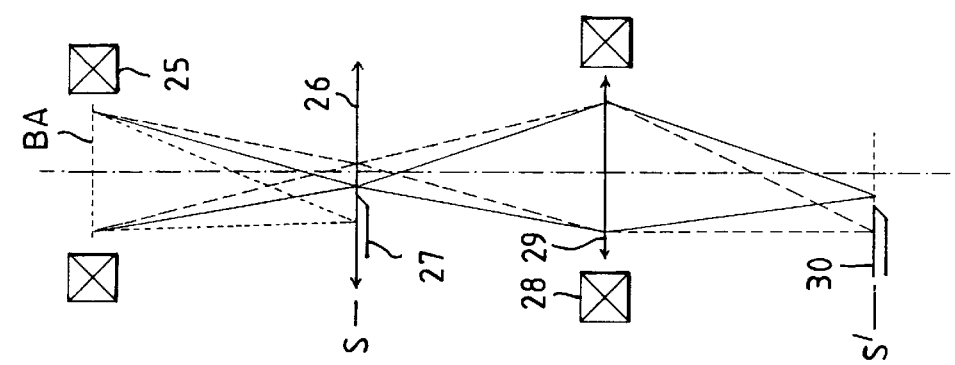
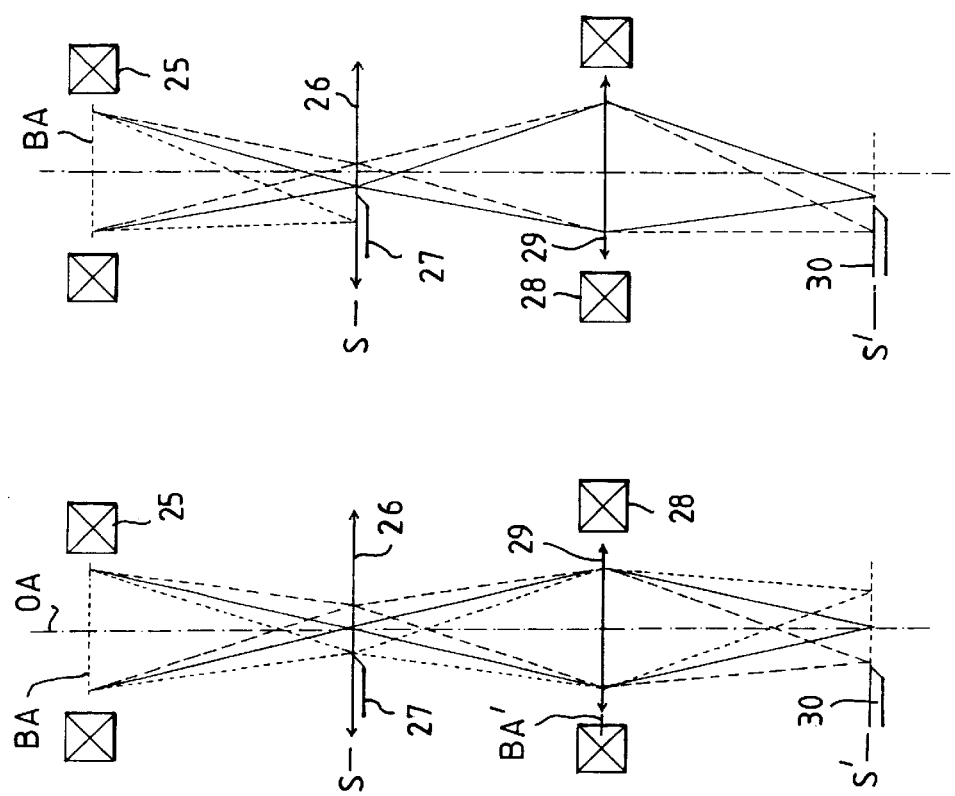

ENERGY FILTER, PARTICULARLY FOR AN ELECTRON MICROSCOPE

BACKGROUND OF THE INVENTION

1. Field of the Invention

The present invention relates to an energy filter, and more particularly to an energy filter for an electron microscope.

2. Discussion of Relevant Art

Imaging energy filters for electron microscopes are known, for example, from U.S. Pat. Nos. 4,812,652; 4,740,704; 4,740,261 and 5,449,914. These energy filters always have at their exit two distinct planes, the achromatic image plane and the spectrum plane, the spacing of which is the so-called Helmholtz length and amounts to about 50 mm to 70 mm. All the beams which emerge from a common point of the object or of the diffraction image are focused in the achromatic image plane, independently of their energy. A local focusing in the achromatic image plane is thus also spoken of. In the spectrum plane, on the other hand, the beams of the same energy are focused at a point, so that a spectrum of the electron beam results in the energy-dispersive direction. Energy focusing in the spectrum plane is thus also spoken of. Either the achromatic plane or the spectrum plane can be imaged on the recording plane, in which a fluorescent screen or an electron detector is arranged, by means of a projection system, consisting of a transfer lens and at least one projection lens. An energy window for imaging can be selected with a slit diaphragm arranged in the spectrum plane and having a defined width in the energy-dispersive direction. The width of the energy window is then dependent on the application. For elastic bright field imaging and for energy loss imaging, energy bandwidths in the region of 4–25 eV are meaningful. For a parallel detection of a spectrum, it should be possible to select an energy region of 50 eV up to 500 eV.

An arrangement for the setting of different energy bandwidths in the spectrum plane is provided in U.S. Pat. No. 4,812,652, and has two slit edges which are mechanically movable relative to each other. In principle, optional slit widths can be set with this arrangement. The symmetrical and parallel motion of the slit jaws of course requires an expensive mechanism. And because of mechanical hysteresis effects, an automatically reproducible setting of the energy bandwidth is possible only by means of measurement of the slit width. Since, furthermore, the two slit edges have to be arranged in different planes for constructional reasons, shadowing effects arise at small energy bandwidths.

Alternatively, it is conceivable to provide several slit diaphragms of different slit widths in a diaphragm changer arranged in the spectrum plane. The production of corresponding slit diaphragms with fixed slit dimensions is relatively easy and correspondingly inexpensive. The variation of the energy bandwidth of course requires a mechanical changing of the slit width by means of the diaphragm changer. The choice of selectable energy bandwidths is severely restricted thereby. And, because of the required accuracy of positioning, of one $\mu$m, an automation of the energy bandwidth setting is very expensive.

Transmission electron microscopes or scanning electron microscopes are already known from the U.S. Pat. Nos. 5,013,913 and 5,483,073; in them, the setting of different aperture diaphragms or illuminating field diaphragms takes place by electron-optical choice of a suitable diaphragm aperture. For this purpose, a respective diaphragm is installed in the electron microscope and has numerous round diaphragm apertures with different aperture diameters. Selection, or setting to a diaphragm with a defined diaphragm diameter, takes place by the deflection and subsequent restoring of the electron beam. In contrast to the situation at the output side of an energy filter, however, much more room for the arrangement of the deflection system is available in the beam path on the illumination side.

SUMMARY OF THE INVENTION

The object of the present invention is to provide an imaging electron energy filter, with which a changeover to different energy bandwidths can take place without mechanical adjustment work by the operator. This object is attained by an energy filter having an exit image plane (BA) and a dispersion plane (S). The filter comprises a diaphragm arrangement for energy selection in the dispersion plane (S) or in a plane (S') conjugate to the dispersion plane (S), and at least one deflecting system preceding the diaphragm arrangement. The deflecting system effects a deflection of an electron beam, wherein setting of different energy bandwidths takes place by different excitation of the deflecting system which results in different deflections of the electron beam relative to the diaphragm arrangement.

For energy selection, the energy filter according to the invention has a diaphragm arrangement in the dispersion plane or in a plane conjugate to the dispersion plane, and at least one deflecting system which precedes the diaphragm arrangement and effects a deflection of the electron beam. The setting of different energy bandwidths takes place by different excitation of the deflecting system and the resulting different deflection of the electron beam relative to the diaphragm arrangement.

The setting of the energy bandwidth takes place electron optically in the filter according to the invention, so that any mechanical adjustment effort when changing the energy bandwidth is dispensed with. All that is required for changing the energy bandwidth is to change the excitation of the deflecting system and also the excitation of further deflecting systems if such further deflecting systems are provided for deflecting the electron beam back to the optical axis. The diaphragm arrangement itself then remains stationary relative to the optical axis and relative to the mechanical structure of the electron microscope. The values of the different excitations of the deflecting system or deflecting systems can be determined empirically during the commissioning of the equipment and can be stored. In later operation of the equipment, these stored values are then called up, and the excitation of the deflecting system or systems is set to the associated stored values according to the desired energy region.

The setting to different energy bandwidths takes place by deflection perpendicularly to the energy-dispersive direction of the filter. A deflection system which effects a one-dimensional deflection—a deflection in only one direction—is sufficient for this deflection, when the excitation of the dispersive elements of the energy filter is simultaneously slightly changed when the deflection is changed. Slight error adjustments between the direction perpendicular to the energy-dispersive direction and the deflecting direction of the deflecting system can be compensated thereby. The relative change of the excitation of the dispersive elements required for this purpose can then be smaller than 1%, so that this excitation change has no detectable influence on the dispersion.

Several slit-shaped apertures with different slit lengths, separated from each other by narrow intermediate bridges, can be provided for energy selection on a diaphragm disk.

The bridge widths should be a maximum of 10% of the slit width. Alternatively, the diaphragm arrangement can have only a single opening with a stepped edge, which has different lengths of apertures in the energy-dispersive direction, in dependence on the position perpendicular to the energy-dispersive direction. A greater number of energy bandwidths which can be set is obtained with such a diaphragm arrangement, since the different slit lengths are selected by the selection of different regions of one and the same aperture.

In a simple embodiment of the invention, the deflection takes place about a real or virtual transition point which coincides with the point of intersection of the optical axis and the exit image plane of the filter. By means of a transfer lens which follows the diaphragm arrangement and which images the exit plane of the filter in a plane conjugate thereto, it is insured that the central position of the achromatic plane remains unaltered. There is therefore no image drift in dependence on the selected energy bandwidth. A single deflecting system in the achromatic image plane is then sufficient for the deflection when the achromatic image plane, seen in the beam direction, lies far enough behind the dispersive components of the filter and consequently a deflecting system can be arranged in the achromatic image plane. If however the achromatic image plane is too close to the dispersive elements—or even within the dispersive elements—and is therefore not accessible for a deflecting system, a double deflecting system is required, the two components of which are excited such that the deflection takes place around a virtual transition point in the achromatic image plane. It is however a disadvantage of this arrangement that both the transfer lens and also the succeeding lenses for further imaging have different off-axis irradiation according to the selected energy bandwidth, so that in some circumstances image errors can arise which depend on the energy bandwidth selected.

The problem of the imaging errors which depend on the selected energy bandwidth can be avoided, according to a further embodiment, in that a double deflecting system is arranged before the diaphragm arrangement and a further, simple deflecting system follows the transfer lens. The two elements of the double deflecting system are then always excited in combination so that the electron beam always passes centrally through the transfer lens, independently of the selected energy bandwidth and thus independently of the position on the diaphragm arrangement. The remaining image deflection behind the transfer lens is then compensated by the simple deflecting system, such that no image displacement occurs in the image plane of the transfer lens. Consequently no off-axis irradiation which depends on the selected energy bandwidth occurs also in the succeeding imaging stages.

Alternatively, the problem of the image errors which depend on the selected energy bandwidth can also be avoided in that three simple deflecting systems are arranged before the transfer lens, one of which effects a deflection in the spectrum plane. The deflecting system which is located in front of the slit arrangement effects a deflection of the electron beam from the optical axis; the deflecting system arranged in the spectrum plane effects a deflection back to the optical axis, and the following deflecting system effects a further transition such that the electron beam thereafter passes centrally with respect to the optical axis.

In an embodiment in which the energy bandwidth is continuously adjustable, two diaphragm arrangements are arranged in two conjugate planes. Both diaphragm arrangements can then consist of simple slit edges. Between the two image planes, a deflecting system is provided in a plane conjugate to the achromatic image plane. The electron beam is deflected by the deflecting system which precedes the first diaphragm arrangement, such that either the lower or the upper portion of the spectrum is cut off by the second deflecting system. The electron beam is then again deflected, by the second deflecting system, so that the energy filtering takes place at the opposite end of the spectrum by means of the second diaphragm arrangement.

BRIEF DESCRIPTION OF THE DRAWINGS

Details of the invention will now be described taken together with the drawings, in which:

FIG. 1a shows a section through a transmission electron microscope with an energy filter according to a first preferred embodiment of the present invention;

FIG. 1b shows a detail representation of the beam path at the exit of the energy filter in the embodiment according to FIG. 1a, in a plane perpendicular to FIG. 1a;

FIG. 1c shows a detail representation of the beam path at the end of the energy filter for a simplified embodiment of the invention;

FIG. 2 shows a plan view of a diaphragm arrangement in the energy filters according to FIGS. 1a–1c;

FIG. 3 shows a detail representation of the beam path in the rear portion of the energy filter for a further preferred embodiment of the invention;

FIGS. 4a and 4b are principle sketches of the beam path in the rear portion of the energy filters for a first preferred embodiment with continuously adjustable energy bandwidth, and FIGS. 5a and 5b are principle sketches of the beam path in the rear portion of the energy filter for a second preferred embodiment with continuously adjustable energy bandwidth.

DETAILED DESCRIPTION OF PREFERRED EMBODIMENTS

The upper portion of the transmission electron microscope shown in FIG. 1a has a conventional structure, known from U.S. Pat. No. 4,812,652. The electron source is denoted by (1). A collimated electron beam is produced from the electrons emerging from the electron source (1) by a two-stage condenser (2, 3) which follows the electron source (1), and its aperture is determined by the diameter of opening of the aperture diaphragm (4). The object (6), positioned in the pole shoe gap of the objective (5), is illuminated with this collimated electron beam. A manipulator (6a) which is passed through the objective lens (5) is arranged for a manipulation of the object (6).

An enlarged image of the object (6) or of the diffraction diagram of the object (6) is produced in the entry image plane (not shown) of the energy filter (11–16). The size of the transferred image field is then determined by the diameter of opening of the field diaphragm (7) which follows the objective (5).

The imaging conditions before entry into the energy filter (11–16) then correspond to the imaging conditions described in U.S. Pat. No. 4,812,652, so that an image of the object lies in the entry image plane of the filter (11–16), and an image of the electron source (1) lies in the entry crossover plane of the filter (11–16), independently of the magnification which is set in the imaging of the object. When taking object diffraction diagrams, an image of the electron source (1) lies in the entry image plane of the energy filter (11–16) and an image of the object (6) lies in the entry crossover plane of the energy filter (11–16). A field diaphragm (not shown) is arranged in or near the entry image plane, and limits the extent of the caustic; its diameter of opening is chosen so that the recording surface of the detector is completely illuminated.

The dispersive components (11, 11a–11d) of the energy filter are constructed as a so-called omega filter, corresponding to U.S. Pat. No. 4,740,704 or to U.S. Pat. No. 5,449,914. The dispersive components of the filter image the entry image plane achromatically in the exit image plane (BA), and the entry crossover plane dispersively in the spectrum plane (S). The rear portion of the energy filter is shown in FIG. 1, greatly enlarged in the direction along the optical axis for the sake of clarity; in reality, the exit image plane (achromatic image plane) (BA) lies about in the middle of the last sector magnet (11d) of the filter, and the spectrum plane (S) lies at a distance behind the last sector magnet (11d) corresponding to the order of magnitude of the deflecting radius in the sector magnets (11a–11d).

The exit side portion of the energy filter contains, between the achromatic image plane (BA) and the spectrum plane (S), a double deflecting system (12, 13), the components of which are respectively constructed as one-dimensional deflecting systems (which effect a deflection in one direction only), and a diaphragm arrangement (14) in the spectrum plane. There follow behind the spectrum plane (S), seen in the beam direction, a transfer lens (15) and a further simple deflecting system (16). The double deflecting system (12, 13), in dependence on the energy bandwidth which is set, effects a deflection of the electron beam perpendicular to the dispersive direction of the filter, i.e., perpendicular to the plane of the diagram in FIG. 1a, such that the electron beam falls on the regions of the diaphragm arrangement which effect the desired energy filtering in the spectrum plane, and at the same time always runs centrally through the transfer lens (15), independently of the energy bandwidth which is set. By this choice of the deflection through the double deflecting system (12, 13) it is attained that the transfer lens produces no errors dependent on the energy bandwidth which is set. The transfer lens (15) is excited so that the achromatic image plane (BA) is imaged in an achromatic image plane (BA') conjugate to it and behind the further single deflecting system (16). The further simple deflecting system (16) is excited such that the image arising in the image plane (BA') which is conjugate to the achromatic image plane (BA) again lies symmetrically of the optical axis. The image arising in the conjugate image plane (BA') is then imaged, enlarged, on a fluorescent screen or image detector. The setting of the projection system (17, 18) is here again analogous to the electron microscope known from U.S. Pat. No. 4,812,652.

The deflection of the electron beam effected by the double deflection system (12, 13) and the return transition of the electron beam effected by the simple deflecting system (16) then takes place perpendicularly to the spectrum direction and thus perpendicularly to the plane of the diagram in FIG. 1a. This circumstance is shown enlarged in FIG. 1b. When the deflection of the electron beam effected by the double deflecting system (12, 13) is changed, the excitation of the dispersive elements (11a–11d) of the filter (11) is simultaneously slightly changed. It is thereby attained without additional constructional cost that even when there are slightly erroneous adjustments between the perpendicular to dispersive direction of the filter (11) and the deflection direction of the double deflecting system (12,13), the deflection which is effected occurs perpendicular to the energy-dispersive direction.

The diaphragm arrangement (14) is shown in plan view in FIG. 2. This diaphragm arrangement (14) is arranged, in the electron microscope of FIG. 1a, perpendicular to the plane of the diagram in FIG. 1a, such that the direction of the arrow in FIG. 2 which indicates the direction of the spectrum is aligned in the dispersion direction and thus parallel to the plane of the diagram in FIG. 1a. The diaphragm arrangement has a single opening (19) with a stepped edge. Regions (19a–19g) arise due to this stepped edge, and are selectable for different energy bandwidths. The step arrangement is respectively symmetrical, in the spectrum direction, to the plane in which the optical axis (OA) intersects the diaphragm arrangement (14). The diaphragm arrangement itself has, perpendicular to the plane of the diagram in FIG. 2, a thickness of 5 $\mu$m at the edge of the opening and increasing to 100 $\mu$m with distance from the opening. The relatively thick construction remote from the diaphragm opening (19) insures that electrons which experience no energy loss in the object (6) cannot transmit through the diaphragm. At the same time, it is attained by the relatively thin construction in the region of the diaphragm opening (19) that the diaphragm edges heat up sufficiently so that contamination depositing on the diaphragm arrangement is burnt off. The reasonable dimension of the regions (19a–19g) perpendicular to the energy-dispersive direction depends on the extent of the caustic, and amounts to between 0.1 and 0.15 mm.

The steps of the diaphragm opening (19) are chosen with respect to their length in dependence on the dispersion of the filter, such that on setting the electron beam to the longest diaphragm opening (19a), an energy bandwidth of 500 eV is obtained, and on setting to the shortest diaphragm region (19g), an energy bandwidth of 4 eV is obtained.

FIG. 1c shows the beam path of a simplified embodiment, in a plane perpendicular to the plane of the diagram in FIG. 1a. In this embodiment, the simple deflecting system (16) behind the transfer lens (19) is dispensed with. Since nevertheless no image displacement takes place in the achromatic image plane (BA') conjugate to the achromatic image plane (BA), the double deflecting system (12', 13') is excited such that a deflection of the electron beam takes place about a virtual transition point (K) which lies on the optical axis in the achromatic image plane (BA). The return transition of the electron beam then takes place exclusively by means of the transfer lens (15). With this arrangement, the beam path is of course off-axis in the transfer lens (15) and also in the subsequent projection system (17, 18) (see FIG. 1a), so that imaging errors can occur here in dependence on the energy bandwidth which is set.

The simplified embodiment shown in FIG. 1c can be further simplified when the achromatic image plane (BA) lies behind the dispersive elements of the filter and is consequently accessible. In this case, as shown dashed in FIG. 1c, a simple deflecting system (12") can also be arranged in the achromatic image plane (BA) instead of the double deflecting system (12', 13').

In both embodiments according to FIG. 1c, the diaphragm arrangement (14) is constructed according to FIG. 2.

The embodiment shown in FIG. 3 is comparable, as regards imaging properties, with the embodiment according to FIGS. 1a and 1b. The embodiment shown in FIG. 3 contains, in addition to the transfer lens (15), which again effects the imaging of the achromatic image plane (BA) in the achromatic image plane (BA') conjugate to it, three single deflecting systems (22, 23, 24) which are all arranged before the transfer lens (15) in the beam direction. The middle deflecting system (23) is then arranged in the spectrum plane. The first deflecting system effects a deflection of the electron beam corresponding to the selected energy bandwidth, and the middle deflecting system (23) effects a return transition of the electron beam to the optical axis. The third deflecting system (24) effects a transition such that the electron beam runs behind the third deflecting system (24) symmetrically to the optical axis OA. The diaphragm arrangement (14) in this embodiment is also constructed corresponding to FIG. 2.

FIGS. 4a and 4b show the beam path of a system for variable slit width choice which transfers the achromatic image plane (BA) and the spectrum at an imaging scale of 1:1, so that the distance (Helmholz length) between the achromatic image plane and the spectrum plane also remains the same. Seen in the beam direction, this embodiment has firstly a deflecting system (25) again, which effects a transition around the intersection of the optical axis (OA) with the achromatic image plane (BA). With an accessible achromatic image plane, a simple deflecting system is sufficient for this. Should the achromatic image plane not be accessible, the deflecting system (25) is constructed as a double deflecting system which is arranged behind the achromatic image plane (BA) and is excited such that there results a virtual transition point around the point of intersection of the optical axis with the achromatic image plane. A first diaphragm arrangement (27) consists of a slit edge and is arranged in the pole shoe gap of a first transfer lens (26). The transfer lens (26) images the achromatic image plane (BA) into a plane (BA') conjugate to it. A second lens (29) and a second deflecting system (28) are arranged in this conjugate plane (BA'). The second lens thereby acts to a certain extent as the field lens, and images the spectrum plane (S) into a spectrum plane (S') conjugate to it. The first slit edge (27) serves to filter either the upper or the lower end of the spectrum, while the second slit edge (30) serves for filtering at the other end of the spectrum.

The beam path is shown in FIG. 4a for the case the deflecting systems (25, 28) are both not excited. The first transfer lens (26), because of its arrangement in the spectrum plane, effects solely an image rotation of the spectrum. This lens transfers on a 1:1 imaging scale the achromatic image plane (BA) into the plane (BA') conjugate thereto and likewise coinciding with the main plane of the second transfer lens (29). When the deflecting systems (25, 28) are not excited, besides the reference energy $E_0$(full line), the whole energy region as far as $E_0-\Delta E$ (dotted line) and $E_0+\Delta E$ (dashed line) is selected. An optionally smaller energy bandwidth can be set by a suitable excitation of the deflecting system (25, 28). This circumstance is illustrated in FIG. 4b, in which the region of lower energy (dashed line) is partially filtered out by the first slit edge (27), and the region of higher energy (dashed line) is partially filtered out by the second slit edge.

The arrangement shown in FIGS. 4a and 4b is again followed by a projection system corresponding to FIG. 1a, by which the spectrum or the achromatic image plane is imaged in the recording plane.

In the alternative embodiment shown in FIGS. 5a and 5b, the first transfer lens (26) is arranged behind the spectrum plane (S) such that the spectrum plane (S) is located in the forward focal point of the transfer lens (26). Simultaneously, the first transfer lens (26) again images the achromatic image plane (BA) in a plane (BA') conjugate thereto. This conjugate plane is followed by a second transfer lens (29) which is excited identically to the first transfer lens (26). An image (S') of the spectrum plane arises in the focal plane of the second transfer lens (29). Simultaneously, the second transfer lens (29) images the plane (BA') conjugate to the achromatic image plane (BA) in the exit image plane (BA"). By the telescopic arrangement of the two lenses (26, 29), the spectrum planes (S, S') are imaged on a 1:1 imaging scale, and also the achromatic image plane (BA) is imaged in the exit plane (BA") on a 1:1 imaging scale.

The energy width setting takes place analogously to the embodiment according to FIGS. 4a and 4b, by corresponding excitation of the two deflecting systems (25 and 28) in the achromatic image plane (BA) and in the plane (BA') conjugate thereto. The fraction of the spectrum of lower energy is again filtered out by a slit edge (27) in the spectrum plane (S), and the fraction of higher energy is filtered out by a second slit edge (30) in the plane (S') conjugate to the spectrum plane (S). It is unimportant which of the two slit edges (27, 30) acts on the lower energy or higher energy portion of the spectrum, since this only depends on the side of the optical axis on which the slit edges (27, 30) are arranged. It is to be noted that in the arrangement according to FIGS. 5a and 5b, the plane (S') conjugate to the spectrum plane (S) and the achromatic exit plane (BA") are interchanged in the sequence, as against the achromatic image plane (BA) and the spectrum plane (S). By this interchange of the achromatic image plane and the spectrum plane, this embodiment is particularly advantageous in energy filters with high dispersion, since smaller magnifications in spectrum imaging are made possible with the following projection system.

It is evident that the deflection of the electron beam effected by the deflecting system (25, 28) in the embodiments in FIGS. 4a, 4b and 5a, 5b occurs in the energy-dispersive direction of the filter.

I claim:

1. An energy filter having an exit image plane (BA) and a dispersion plane (S), comprising:

a diaphragm arrangement (14, 27, 30) for energy selection in said dispersion plane (S) or in a plane (S') conjugate to said dispersion plane (S), and at least one deflecting system (12, 13; 12', 13'; 12', 25) preceding said diaphragm arrangement (14, 27, 30), that effects a deflection of an electron beam, wherein setting of different energy bandwidths takes place by different excitation of said deflecting system (12, 13; 12', 13'; 12", 25, 28), which results in different deflections of said electron beam relative to said diaphragm arrangement (14, 27, 30).

2. The energy filter according to claim 1, wherein the setting of different energy bandwidths takes place by deflection perpendicular to an energy-dispersive direction of the energy filter.

3. The energy filter according to claim 2, further comprising dispersive elements (11a–11d), wherein a change of excitation of said dispersive elements (11a–11d) takes place when excitation of said deflecting system (12, 13; 12', 13'; 12', 25) is changed.

4. The energy filter according to claim 1, wherein the deflection takes place around a real or virtual transition point (K) that coincides with an intersection point of an optical axis (OA) of the energy filter with said exit image plane (BA).

5. The energy filter according to claim 1, further comprising a transfer lens (15; 26) for imaging said exit image plane (BA), arranged after said diaphragm arrangement (14).

6. The energy filter according to claim 1, further comprising a second deflecting system (16; 24; 28) arranged after said diaphragm arrangement (14).

7. The energy filter according to claim 6, further comprising a second diaphragm arrangement (30) arranged after said second deflecting system (28).

8. The energy filter according to claim 7, wherein said first and said second diaphragm arrangements (27, 30) are constructed as slit edges.

9. The energy filter according to claim 7, wherein said second deflecting system (28) is arranged in a plane (BA') conjugate to said exit image plane (BA).

10. The energy filter according to claim 7, further comprising a second transfer lens (29) preceding said second diaphragm arrangement (30).

11. The energy filter according to claim 1, wherein said diaphragm arrangement (14) has one or more openings (19) that have a different length of opening (19a–19g) depending upon the position of said opening perpendicular to an energy-dispersive direction of the energy filter (11, 12, 13, 14).

12. The energy filter according to claim 1, in combination with an electron microscope, wherein the energy filter is preceded by an arrangement of several imaging stages (5, 8, 9, 10) for variation of magnification of electron-optical imaging.

13. The energy filter according to claim 12, wherein positions of an entry image plane and an entry crossover plane of the energy filter are stationary, independently of magnification setting.

\* \* \* \* \*

UNITED STATES PATENT AND TRADEMARK OFFICE
CERTIFICATE OF CORRECTION

PATENT NO. : 6,040,576
DATED : March 21, 2000
INVENTOR(S) : Benner

It is certified that error appears in the above-identified patent and that said Letters Patent is hereby corrected as shown below:

<u>Column 8,</u>
Line 33, cancel "an exit image plane (BA) and".
Line 57, change "said" to -- an --.
Line 61, change "said" to -- an --.

<u>Column 9,</u>
Line 6, change "said" to -- an --.

Signed and Sealed this

Second Day of November, 2004

JON W. DUDAS
*Director of the United States Patent and Trademark Office*